(12) United States Patent
Lee

(10) Patent No.: US 9,715,934 B2
(45) Date of Patent: Jul. 25, 2017

(54) PERIPHERAL CIRCUIT, SEMICONDUCTOR MEMORY DEVICE AND OPERATING METHOD OF THE SEMICONDUCTOR DEVICE AND/OR PERIPHERAL CIRCUIT

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 21 days.

(21) Appl. No.: 15/091,702

(22) Filed: Apr. 6, 2016

(65) Prior Publication Data

US 2017/0125100 A1    May 4, 2017

(30) Foreign Application Priority Data

Nov. 3, 2015   (KR) .................. 10-2015-0153908

(51) Int. Cl.
*G11C 16/08* (2006.01)
*G11C 16/14* (2006.01)
*G11C 16/16* (2006.01)
*G11C 11/56* (2006.01)

(52) U.S. Cl.
CPC .......... *G11C 16/08* (2013.01); *G11C 11/5635* (2013.01); *G11C 16/14* (2013.01); *G11C 16/16* (2013.01)

(58) Field of Classification Search
CPC ......... G11C 16/08; G11C 16/16; G11C 16/14; G11C 11/5635
See application file for complete search history.

(56) References Cited

U.S. PATENT DOCUMENTS

| | | | | |
|---|---|---|---|---|
| 6,031,764 A | * | 2/2000 | Imamiya ............ | G11C 16/0483 365/185.11 |
| 7,212,447 B2 | * | 5/2007 | Aritome ............. | G11C 16/0483 365/185.17 |
| 7,403,427 B2 | * | 7/2008 | Chen ...................... | G11C 16/16 365/185.11 |
| 8,576,635 B2 | * | 11/2013 | Kim .................... | G11C 16/0483 365/185.22 |
| 8,854,891 B2 | * | 10/2014 | Aritome ................ | G11C 16/10 365/185.18 |
| 8,908,431 B2 | * | 12/2014 | Shim ...................... | G11C 16/10 365/185.02 |
| 9,142,305 B2 | * | 9/2015 | Dunga ..................... | G11C 8/08 |

FOREIGN PATENT DOCUMENTS

| | | | |
|---|---|---|---|
| KR | 100781041 B1 | * 11/2007 | ............ G11C 16/16 |
| KR | 1020110038116 A | 4/2011 | |
| KR | 1020130008219 A | 1/2013 | |

* cited by examiner

*Primary Examiner* — Hoai V Ho
*Assistant Examiner* — Roberto Mancera, Jr.
(74) *Attorney, Agent, or Firm* — William Park & Associates Ltd.

(57) ABSTRACT

The present disclosure relates to an electronic device, and more particularly, to a peripheral circuit, semiconductor memory device, and an operating method of the semiconductor memory device and/or peripheral circuit. The method of operating the semiconductor memory device may include turning on pass transistors.

18 Claims, 12 Drawing Sheets

SELECTED BLOCK

UNSELECTED BLOCK

… (1)

PERIPHERAL CIRCUIT, SEMICONDUCTOR MEMORY DEVICE AND OPERATING METHOD OF THE SEMICONDUCTOR DEVICE AND/OR PERIPHERAL CIRCUIT

CROSS-REFERENCE TO RELATED APPLICATION

The present application claims priority under 35 U.S.C. §119(a) to Korean patent application number 10-2015-0153908 filed on Nov. 3, 2015, in the Korean Intellectual Property Office, the entire disclosure of which is incorporated by reference herein.

BACKGROUND

1. Technical Field

Various embodiments relate generally to an electronic device and, more particularly, to a peripheral circuit, semiconductor memory device, and an operating method of the semiconductor device and/or peripheral circuit.

2. Related Art

Semiconductor memory devices are made of semiconductor materials such as silicon (Si), germanium (Ge), gallium arsenide (GaAs), and indium phosphide (Inp). Semiconductor memory devices are classified into volatile memory devices and non-volatile memory devices.

Volatile memory devices lose stored data when powered off. Examples of volatile memory devices include Static RAM (SRAM), Dynamic RAM (DRAM) and Synchronous DRAM (SDRAM). Non-volatile memory devices retain stored data regardless of power on/off conditions. Examples of non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories are classified into NOR-type memories and NAND-type memories.

SUMMARY

According to an embodiment, a semiconductor memory device may be provided. The semiconductor memory device may include a memory cell array including a plurality of memory cells. The semiconductor memory device may include coupling circuits including pass transistors coupled between global lines and local lines coupled to the plurality of memory cells. The semiconductor memory device may include an address decoder coupled to block word lines coupled to gates of the pass transistors and the global lines.

According to an embodiment, a method of operating a semiconductor memory device may be provided. The semiconductor memory device may include a plurality of memory cells. The method may include turning on pass transistors.

According to an embodiment, a semiconductor memory device may be provided. The semiconductor memory device may include a memory cell array including a plurality of memory cells. The semiconductor device may include coupling circuits including pass transistors coupled between global lines and local lines coupled to the plurality of memory cells.

According to an embodiment, a peripheral circuit may be provided. The peripheral circuit may include pass transistors coupled between global lines and local lines, and an address decoder coupled to a block word line coupled in common to gates of the pass transistors and the global lines. The address decoder may be configured to turn on the pass transistors.

DETAILED DESCRIPTION

Figure 1:
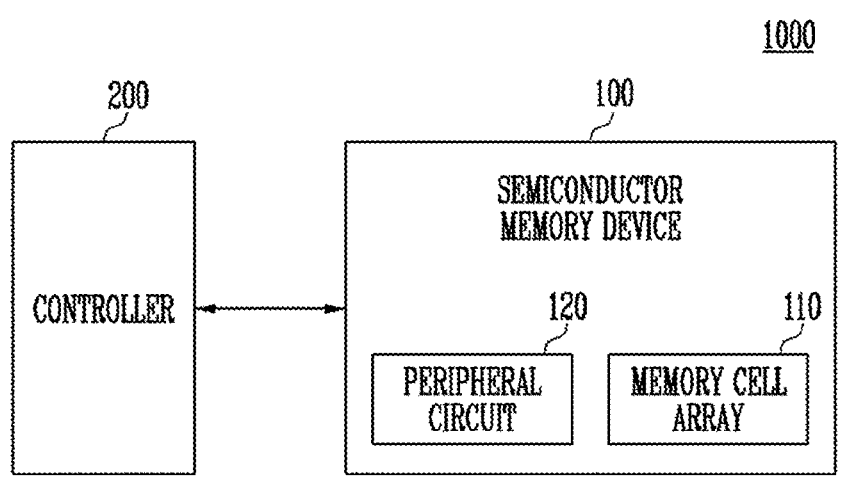
FIG. 1 is a block diagram illustrating a representation of an example of a memory system including a semiconductor memory device and a controller.

Various embodiments may relate to a semiconductor memory device having improved reliability and an operating method thereof.

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the examples of embodiments according to the concepts are not limited to the specific embodiments, but include all changes, equivalents, or alternatives which are included in the spirit and technical scope of the present disclosure.

Terminologies such as first or second may be used to describe various components but the components are not limited by the above terminologies. The above terminologies are used to distinguish one component from the other component, for example, a first component may be referred to as a second component without departing from a scope in accordance with the concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between", or "adjacent to" and "directly adjacent to" need to be interpreted by the same manner.

Terminologies used in the present specification are used only to describe specific examples of embodiments, and are not intended to limit the present disclosure. A singular form may include a plural form if there is no clearly opposite meaning in the context. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if they are not clearly defined in this specification.

Hereinafter, the present disclosure will be described by explaining examples of embodiments with reference to the accompanying drawings.

FIG. 1 is a block diagram illustrating a memory system 1000 including a semiconductor memory device 100 and a controller 200.

Referring to FIG. 1, a memory system 1000 may include a semiconductor memory device 100 and a controller 200.

The semiconductor memory device 100 may operate in response to control of the controller 200. The semiconductor memory device 100 may include a memory cell array 110 including a plurality of memory blocks. According to an embodiment, the semiconductor memory device 100 may be a flash memory device.

The semiconductor memory device 100 may be configured to receive a command and an address from the controller 200 and access a region of the memory cell array which is selected according to the address. In other words, the semiconductor memory device 100 may perform an internal operation corresponding to the command on the region selected by the address. The semiconductor memory device 100 may include a peripheral circuit 120 configured to perform the internal operation.

The semiconductor memory device 100 may perform a program operation, a read operation and an erase operation. During the program operation, the semiconductor memory device 100 may program the region selected according to the address with data. During the read operation, the semiconductor memory device 100 may read data from the region selected by the address. During the erase operation, the semiconductor memory device 100 may erase the data stored in the region selected by the address.

The controller 200 may control the semiconductor memory device 100 to perform a program operation, a read operation or an erase operation. During the program operation, the controller 200 may provide a program command, an address and data to the semiconductor memory device 100. During the read operation, the controller 200 may provide a read command and address to the semiconductor memory device 100. During the erase operation, the controller 200 may provide an erase command and an address to the semiconductor memory device 100.

According to an embodiment, the controller 200 may include compositions, such as a Random Access Memory (RAM), a processing unit, a host interface and a memory interface. RAM may be used as at least one of an operation memory of the processing unit, a cache memory between the semiconductor memory device 100 and a host, and a buffer memory between the semiconductor memory device 100 and the host. The processing unit may control the generation operation of the controller.

The host interface may include a program for data exchange between the host and the controller 200. According to an embodiment, the controller 200 may communicate with the host through at least one of various interface protocols such as Universal Serial Bus (USB) protocol, MultiMedia Card (MMC) protocol, Peripheral Component Interconnection (PCI) protocol, PCI-Express (PCI-E) protocol, Advanced Technology Attachment (ATA) protocol, Serial-ATA protocol, Parallel-ATA protocol, Small Computer Small Interface (SCSI) protocol, Enhanced Small Disk Interface (ESDI) protocol, Integrated Drive Electronics (IDE) protocol and private protocol.

The memory interface may interface with the semiconductor memory device 100. For example, the memory interface may include a NAND interface or a NOR interface.

Figure 2:
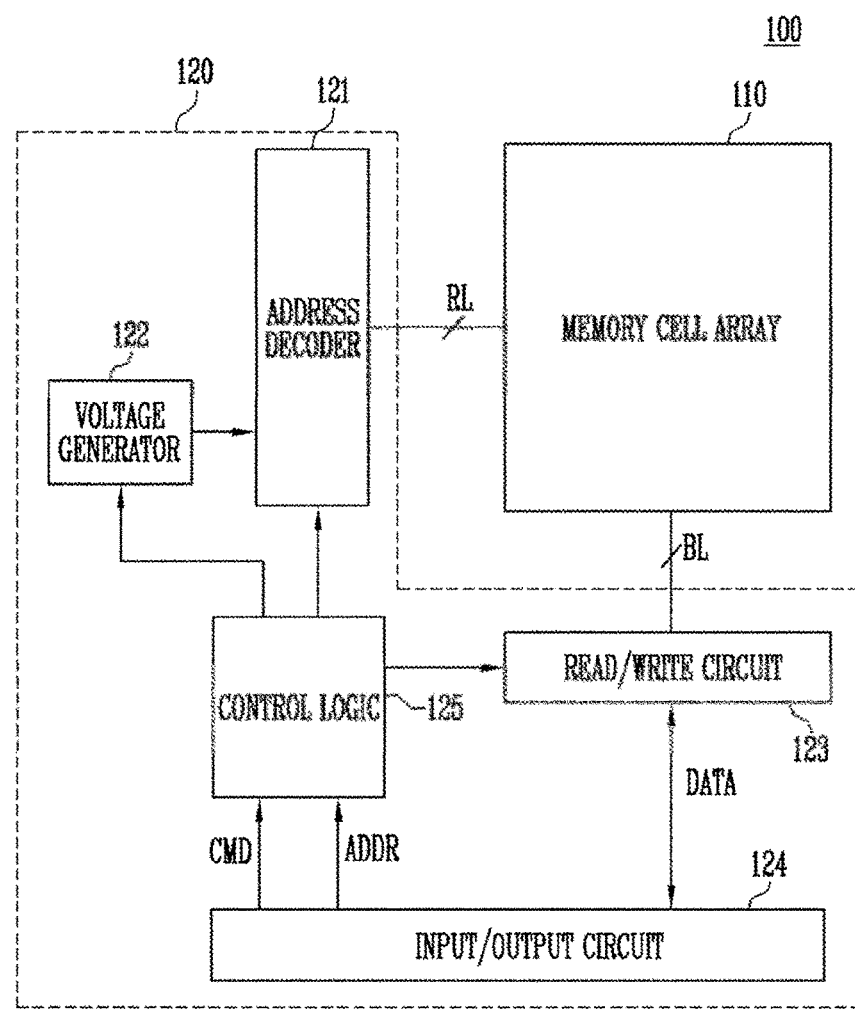
FIG. 2 is a block diagram illustrating a representation of an example of a semiconductor memory device.

FIG. 2 is a block diagram illustrating the semiconductor memory device 100.

Referring to FIG. 2, the semiconductor memory device 100 may include the memory cell array 110 and the peripheral circuit 120.

The memory cell array 110 may be coupled to the address decoder 121 through row lines RL. The memory cell array 110 may be coupled to a read and write circuit 123 through bit lines BL.

The memory cell array 110 may include a plurality of memory blocks. Each of the plurality of memory blocks may include a plurality of memory cells. According to an embodiment, the plurality of memory cells may be memory cells. This will be described below with reference to FIGS. 4 and 5.

The peripheral circuit 120 may include an address decoder 121, a voltage generator 122, the read and write circuit 123, an input/output circuit 124 and a control logic 125.

The address decoder 121 may be coupled to the memory cell array 110 through the row lines RL. The address decoder 121 may be configured to control the row lines RL in response to the control logic 125. The address decoder 121 may receive an address ADDR that the control logic 125 receives through the input/output circuit 124.

According to an embodiment, a program operation and a read operation of the semiconductor memory device 100 may be performed in units of pages. During the program operation and the read operation, the address ADDR may include a block address and a row address. The address decoder 121 may be configured to decode the block address from the received address ADDR. The address decoder 121 may select one memory block according to the decoded block address. The address decoder 121 may be configured to decode the row address from the received address ADDR. The address decoder 121 may select one page of the selected memory block according to the decoded row address. The address decoder 121 may be described with reference to FIG. 3.

According to an embodiment, the erase operation of the semiconductor memory device 100 may be performed in units of memory blocks. During the erase operation, the address ADDR may include a block address. The address decoder 121 may decode the block address and select one memory block according to the decoded block address.

According to an embodiment, the address decoder 121 may include a block decoder, a row decoder and an address buffer.

The voltage generator 122 may operate in response to control of the control logic 125. The voltage generator 122 may generate an internal power voltage by using an external power voltage supplied to the semiconductor memory device 100. For example, the voltage generator 122 may generate an internal power voltage by regulating the external power voltage. The internal power voltage may be provided to the address decoder 121, the read and write circuit 123, the input/output circuit 124 and the control logic 125 and used as an operating voltage of the semiconductor memory device 100.

The voltage generator 122 may generate a plurality of voltages by using at least one of the external power voltage and the internal power voltage. According to an embodiment, the voltage generator 122 may include a plurality of pumping capacitors receiving the internal power voltage. The voltage generator 122 may generate a plurality of voltages by selectively activating the plurality of pumping capacitors in response to control of the control logic 125. For example, the voltage generator 122 may generate various voltages to be applied to the row lines RL, and provide the generated voltages to the address decoder 121. An erase voltage, among the plurality of voltages, may be applied to a bulk region of the memory cell array 110 and transferred to a channel of memory cells of the selected memory block. Some of the plurality of voltages may be transferred to the address decoder 121.

The read and write circuit 123 may be coupled to the memory cell array 110 through the bit lines BL. The read and write circuit 123 may operate in response to control of the control logic 125.

During a program operation, the read and write circuit 123 may transfer data DATA from the input/output circuit 124 to the bit lines BL. The memory cells of the selected page may be programmed according to the transferred data DATA. During a read operation, the read and write circuit 123 may read the data DATA from the memory cells of the selected page through the bit lines BL and output the read data DATA to the input/output circuit 124. During an erase operation, the read and write circuit 123 may float the bit lines BL.

According to an embodiment, the read and write circuit 123 may include page buffers (or page registers) and a column selection circuit.

The control logic 125 may be coupled to the address decoder 121, the voltage generator 122, the read and write circuit 123 and the input/output circuit 124. The control logic 125 may receive the command CMD and the address ADDR from the input/output circuit 124. The control logic 125 may control the semiconductor memory device 100 to perform an internal operation corresponding to the command CMD. The control logic 125 may transfer the address ADDR to the address decoder 121.

Figure 3:
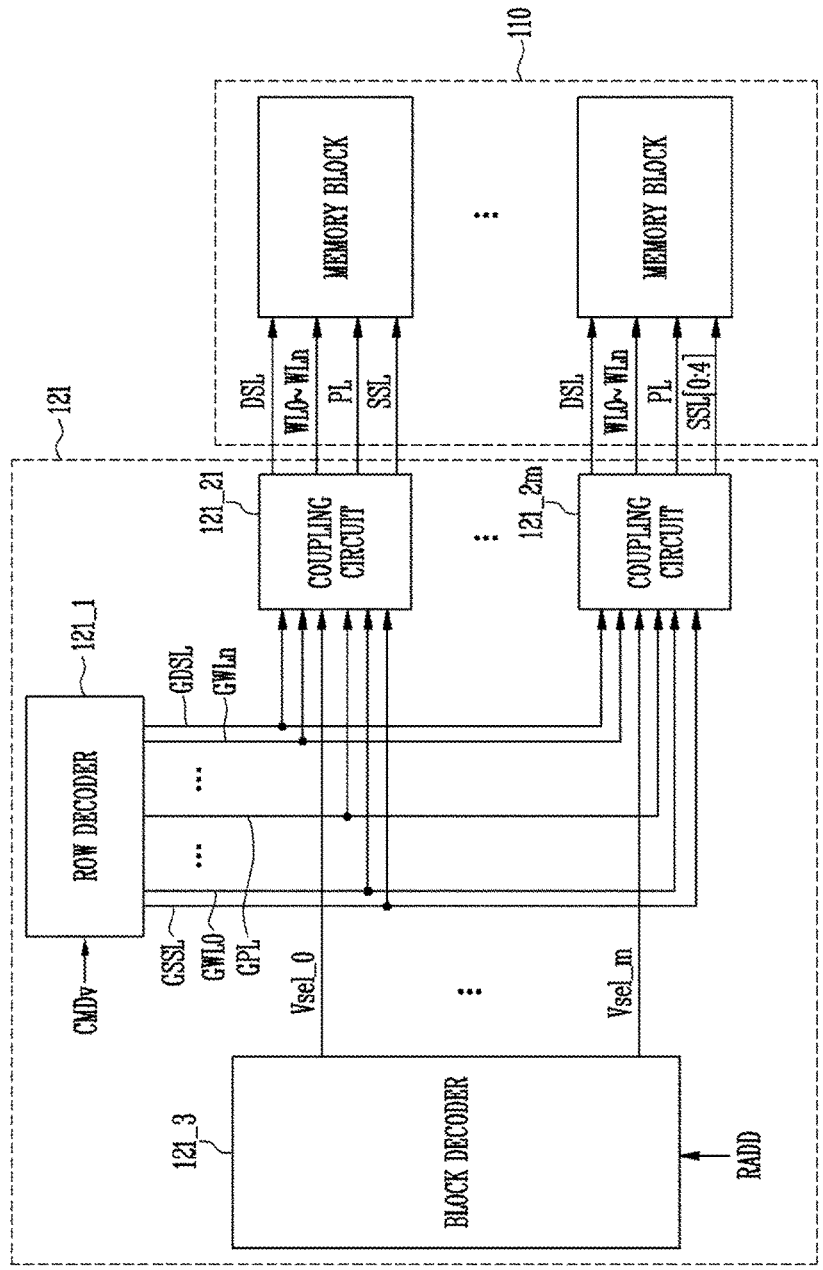
FIG. 3 is a block diagram illustrating a representation of an example of the structure of an address decoder illustrated in FIG. 2.

FIG. 3 is a view illustrating a representation of an example of the structure of an address decoder illustrated in FIG. 2.

Referring to FIG. 3, the address decoder 121 of the semiconductor memory device may include a row decoder 121_1, coupling circuits 121_21 to 121_2m and a block decoder 121_3.

The row decoder 121_1 may be configured to output operating voltages to global lines global source selection line GSSL, global word line zero GWL0 to global word line n GWLn, global pipe line GPL, and global drain selection line GDSL in response to a signal CMDv. For example, the row decoder 121_1 may output operating voltages necessary to perform a program loop, a read operation and an erase loop on the memory cells to the global lines GSSL, GWL0 to GWLn, GPL, and GDSL.

The coupling circuits 121_21 to 121_2m may be coupled between the global lines GSSL, GWL0 to GWLn, GPL, and GDSL and local lines source selection line SSL, word line 0 WL0 to word line n WLn, pipe line PL, and drain selection line DSL of the memory blocks, and operate in response to block selection signals Vsel_0 to Vsel_m of the block decoder 121_3.

In other words, the coupling circuits 121_21 to 121_2m may selectively couple the global lines GSSL, GWL0 to GWLn, GPL, GDSL to the local lines SSL, WL0 to WLn, PL, and DSL of a selected memory block 110 MB in response to the block selection signals Vsel_0 to Vsel_m of the block decoder 121_3 so that operating voltages (e.g., a program voltage, an erase voltage, a read voltage, a pass voltage, a pipe gate voltage, a verify voltage) output to the global lines GSSL, GWL0 to GWLn, GPL, and GDSL from the row decoder 121_1 may be transferred to the local lines SSL, WL0 to WLn, PL, and DSL of the selected memory block.

Each of the coupling circuits 121_21 to 121_2m may include transistors (not illustrated) coupled between the global lines GSSL, GWL0 to GWLn, GPL, and GDSL and the local lines SSL, WL0 to WLn, PL, and DSL of the memory block, respectively. These transistors (not illustrated) may be pass transistors. The coupling circuits 121_21 to 121_2m may couple the global word lines GWL0 to GWLn and the local word lines WL0 to WLn in response to the block selection signals Vsel_0 to Vsel_m. The block selection signals Vsel_0 to Vsel_m may be coupled to the pass transistors through block word lines and may have a greater voltage level than threshold voltages of the pass transistors.

The coupling circuits 121_21 to 121_2m may be provided to each of the memory blocks of the flash memory device. The coupling circuits 121_21 to 121_2m may be selectively operated in response to the block selection signals Vsel_0 to Vsel_m of the block decoder 121_3. For example, a single coupling circuit selected by the block selection signals Vsel_0 to Vsel_m of the block decoder 121_3, among the coupling circuits 121_21 to 121_2m, may be selectively operated. The block selection signals Vsel_0 to Vsel_m may be input through the block word lines coupled to the coupling circuits 121_21 to 121_2m.

The block decoder 121_3 may output the block selection signals Vsel_0 to Vsel_m to the coupling circuits 121_21 to 121_2m, respectively, in response to a row address signal RADD. One of the block selection signals Vsel_0 to Vsel_m may be activated in response to the row address signal RADD, and the other signals may be deactivated. The coupling circuit 121_21 to which the activated block selection signal Vsel_0 is input may transfer the operating voltages, output to the global lines GSSL, GWLO to GWL15, GPL, and GDSL, to the selected memory block without a voltage drop. The coupling circuits 121_2m to which the deactivated block selection signals Vsel_m are input may block the operating voltages, output to the global lines GSSL, GWLO to GWL15, GPL, and GDSL, from being transferred to the memory block.

During an erase operation, the block decoder 121_3 may receive voltages from the voltage generator 122 and transfer the voltages to the block word line BLKWL. During the erase operation, the row decoder 122_1 may receive the voltages from the voltage generator 122 and transfer the transferred voltages to the global lines GSSL, GWLO to GWL15, GPL, and GDSL in response to control of the control logic 125.

Figure 4:
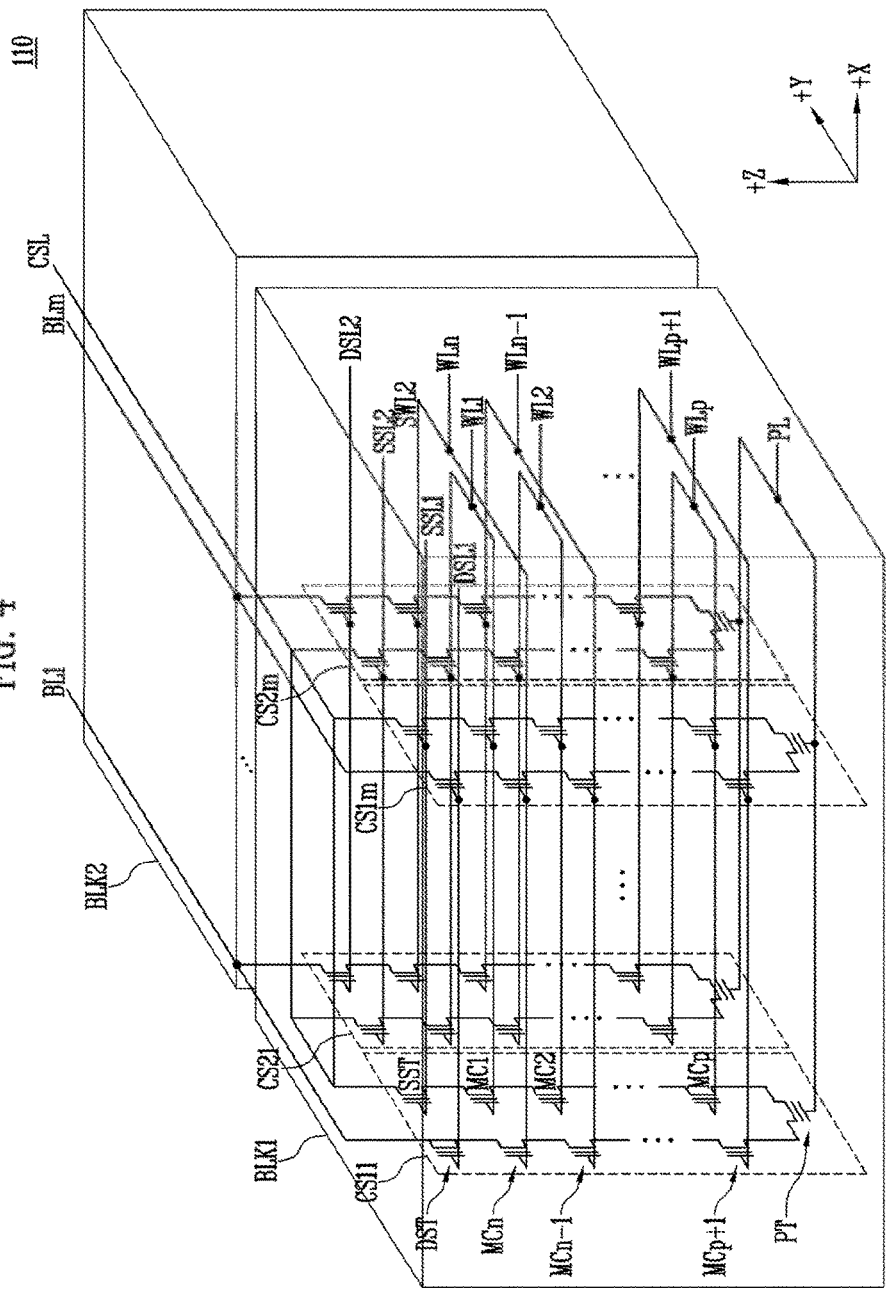
FIG. 4 is a view illustrating a representation of an example of an embodiment of a memory cell array illustrated in FIG. 2.

FIG. 4 is a diagram illustrating a representation of an example of an embodiment of a memory cell array illustrated in FIG. 2.

Referring to FIG. 4, the memory cell array 110 may include a plurality of memory blocks BLK1 to BLKz. Referring to FIG. 4, for convenience of explanation, the internal configuration of only the first memory block BLK1 is illustrated, and the memory blocks BLK2 to BLKz are omitted. However, it is understood that each of the second to zth memory blocks BLK2 to BLKz may have the same configuration or substantially the same configurations as the first memory block BLK1.

Referring to FIG. 4, the first memory block BLK1 may include a plurality of cell strings CS11 to CS1m and CS21 to CS2m. According to an embodiment, each of the cell strings CS11 to CS1m and CS21 to CS2m may have a 'U' shape. In the first memory block BLK1, m cell strings may be arranged in a row direction (i.e., +X direction). For convenience of explanation, FIG. 4 illustrates two cell strings arranged in a column direction (i.e., +Y direction). However, it is understood that three or more cell strings may be arranged in the column direction.

Each of the plurality of cell strings CS11 to CS1m and CS21 to CS2m may include at least one source selection transistor SST, first to nth memory cells MC1 to MCn, a pipe transistor PT, and at least one drain selection transistor DST.

The selection transistors SST and DST and the memory cells MC1 to MCn may have similar structures. According to an embodiment, each of the selection transistors SST and DST and the memory cells MC1 to MCn may include a channel layer, a tunneling insulating layer, a charge storage layer and a blocking insulating layer. According to an embodiment, a pillar for providing a channel layer may be formed in each cell string. According to an embodiment, a pillar for providing at least one of a channel layer, a tunneling insulating layer, a charge storage layer and a blocking insulating layer may be provided to each pillar.

The source selection transistor SST of each cell string may be coupled between a common source line CSL and memory cells MC1 to MCp.

According to an embodiment, source selection transistors of cell strings arranged in the same row may be coupled to a source selection line extending in a row direction, and source selection transistors of cell strings arranged in different rows may be coupled to different source selection lines. FIG. 4 illustrates that the source selection transistors of the cell strings CS11 to CS1m in the first row may be coupled to a first source selection line SSL1. The source selection transistors of the cell strings CS21 to CS2m in the second row may be coupled to a second source selection line SSL2.

According to an embodiment, the source selection transistors of the cell strings CS11 to CS1m and CS21 to CS2m may be coupled in common to a single source selection line.

The first to nth memory cells MC1 to MCn of each cell string may be coupled between the source selection transistor SST and the drain selection transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to a +Z direction and be coupled in series between the source selection transistor SST and the pipe transistor PT. The (p+1)th to nth memory cells MCp+1 to MCn may be sequentially arranged in the +Z direction and be coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to nth word lines WL1 to WLn, respectively.

According to an embodiment, at least one of the first to nth memory cells MC1 to MCn may serve as a dummy memory cell. When a dummy memory cell is provided, a voltage or current of the corresponding cell string may be stably controlled. Therefore, reliability of data stored in the memory block BLK1 may be improved.

A gate of the pipe transistor PT of each cell string may be coupled to a pipe line PL.

The drain selection transistor DST of each cell string may be coupled between the corresponding bit line and the memory cells MCp+1 to MCn. Cell strings arranged in the row direction may be coupled to a drain selection line extending in the row direction. Drain selection transistors of the cell strings CS11 to CS1m in the first row may be coupled to the first drain selection line DSL1. Drain selection transistors of the cell strings CS21 to CS2m in the second row may be coupled to the second drain selection line DSL2.

Cell strings arranged in the column direction may be coupled to a bit line extending in the column direction. As illustrated in FIG. 4, the cell strings CS11 and CS21 arranged in the first column may be coupled to a first bit line BL1, and the cell strings CS1m and CS2m arranged in an mth column may be coupled to an mth bit line BLm.

Memory cells coupled to the same word line in cell strings in the row direction may form a single page. For example, the memory cells coupled to the first word line WL1 from the cell strings CS11 to CS1m in the first row may form a single page. Memory cells coupled to the first word line WL1 from the cell strings CS21 to CS2m in the second row may form another page. When one of the drain selection lines DSL1 and DSL2 is selected, cell strings arranged in one row direction may be selected. Since one of the word lines WL1 to WLn is selected, one page may be selected from selected cell strings.

Figure 5:
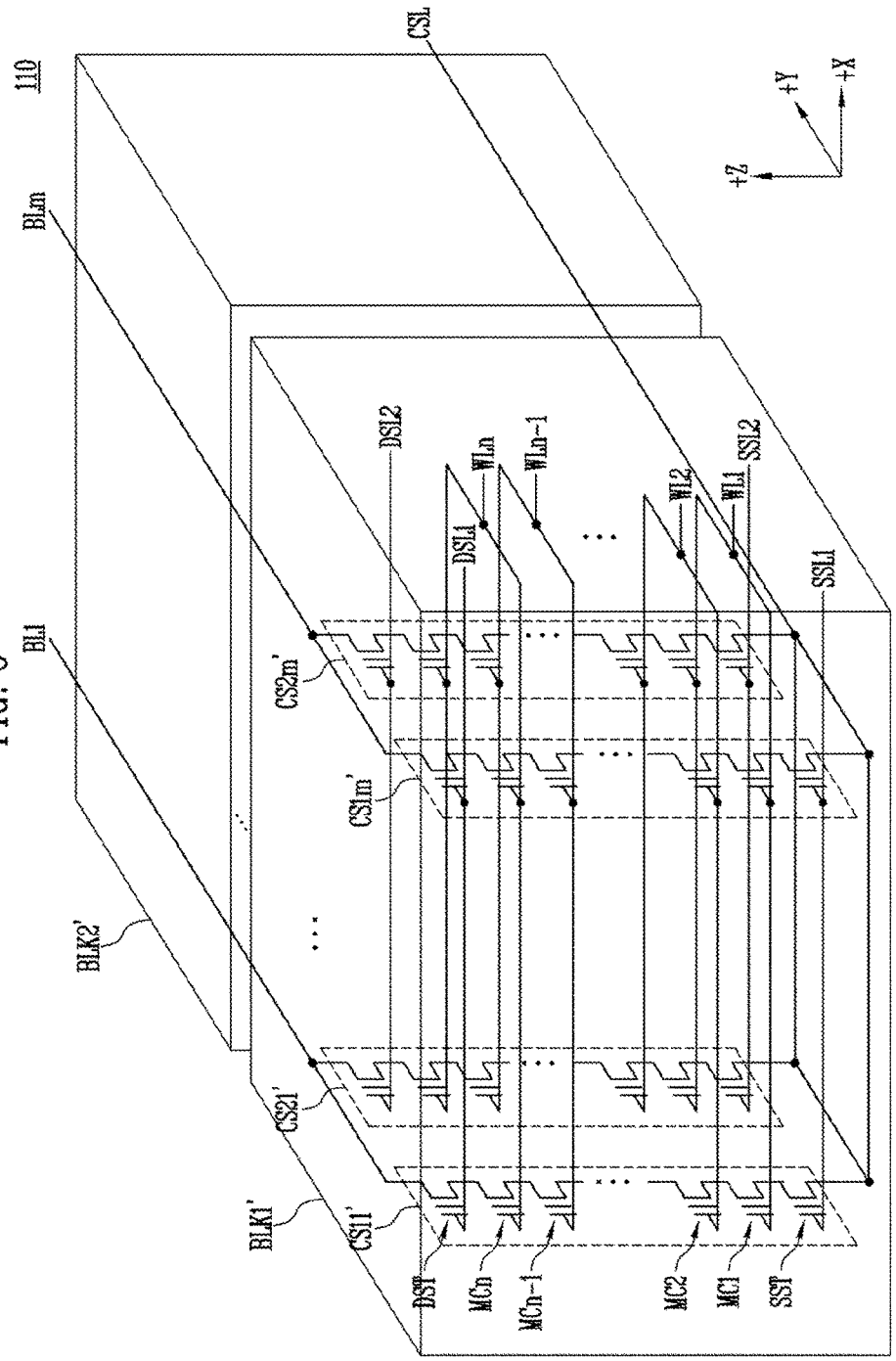
FIG. 5 is a view illustrating a representation of an example of an embodiment of a memory cell array illustrated in FIG. 2.

FIG. 5 is a block diagram illustrating an embodiment of the memory cell array 110 illustrated in FIG. 2.

Referring to FIG. 5, the memory cell array 110 may include a plurality of memory blocks BLK1' to BLKz'. Referring to FIG. 5, the internal configuration of the first memory block BLK1' is illustrated, and the internal configurations of the remaining memory blocks BLK2' to BLKz' are omitted. However, it is understood that each of the second to zth memory blocks BLK2' to BLKz' have the same configuration or substantially the same configurations as the first memory block BLK1'.

The first memory block BLK1' may include a plurality of cell strings CS11' to CS1m' and CS21' to CS2m'. Each of the plurality of cell strings CS11' to CS1m' and CS21' to CS2m' may extend in the +Z direction. In the first memory block BLK1', m cell strings may be arranged in the +X direction. For convenience of explanation, FIG. 6 illustrates two cell strings arranged in the +Y direction. However, it is understood that three or more cell strings may be arranged in the column direction (i.e., +Y direction).

Each of the plurality of cell strings CS11' to CS1m' and CS21' to CS2m' may include at least one source selection transistor SST, first to nth memory cells MC1 to MCn, and at least one drain selection transistor DST.

The source selection transistor SST of each cell string may be coupled between the common source line CSL and the memory cells MC1 to MCn. Source selection transistors of cell strings arranged in the same row may be coupled to the same source selection line. The source selection transistors of the cell strings CS11' to CS1m' arranged in the first row may be coupled to the first source selection line SSL1. The source selection transistors of the cell strings CS21' to CS2m' arranged in the second row may be coupled to the second source selection line SSL2. According to an embodiment, the source selection transistors of the cell strings CS11' to CS1m' and CS21' to CS2m' may be coupled in common to another source selection line.

The first to nth memory cells MC1 to MCn of each cell string may be coupled in series between the source selection transistor SST and the drain selection transistor DST. Gates of the first to nth memory cells MC1 to MCn may be coupled to the first to nth word lines WL1 to WLn, respectively.

According to an embodiment, at least one of the first to nth memory cells MC1 to MCn may be used as a dummy memory cell. When the dummy memory cell is provided, a voltage or a current of the cell string may be stably controlled. Therefore, reliability of data stored in the memory block BLK1'.

The drain selection transistor DST of each cell string may be coupled between the corresponding bit line BL (i.e., BL1 to BLm) and the memory cells MC1 to MCn. Drain selection transistors of cell strings arranged in the row direction may be coupled to a drain selection line extending in the row direction. The drain selection transistors of the cell strings CS11' to CS1m' in the first row may be coupled to the first drain selection line DSL1. The drain selection transistors of the cell strings CS21' to CS2m' in the second row may be coupled to the second drain selection line DSL2.

As a result, the memory block BLK1' illustrated in FIG. 5 may have an equivalent circuit similar to the memory block BLK1 illustrated in FIG. 4, except that the pipe transistor PT is removed from each of the cell strings.

Hereinafter, an erase operation will be described with reference to FIGS. 2 to 5.

When an erase operation is being performed, the voltage generator 122 may generate an erase voltage Verase in response to control of the control logic 125, and the address decoder 121 may apply the erase voltage Verase generated by the voltage generator 122 to the common source line CSL of the memory cell array 110 in response to control of the control logic 125. The source selection transistor SST and the drain selection transistor DST may be controlled to be in a floating state.

Subsequently, a potential level of a channel may be increased in response to a potential level of the common source line CSL. Potential levels of source selection lines and drain selection lines coupled to a plurality of source selection transistors and drain selection transistors in a floating state may be increased in response to the potential level of the channel due to a coupling phenomenon.

Data stored in the first to nth memory cells MC1 to MCn may be erased by the increased potential level of the channel. In other words, electrons stored in charge storage layers of the first to nth memory cells MC1 to MCn may be detrapped by the potential of the channel due to FN tunneling. More specifically, electrons stored in the charge storage layers of the first to nth memory cells MC1 to MCn may flow into the channel and be detrapped by the difference between the increased potential level of the channel and the potential level of the word lines WL1 to WLn having a ground level, or hot holes generated in the channel may flow into the charge storage layers of the first to nth memory cells MC1 to MCn to cause the electrons stored in the charge storage layer to be detrapped. The first to nth word lines WL1 to WLn may maintain the ground level or change to the ground level from the floating state.

After the data of the first to nth memory cells MC1 to MCn are erased by performing the erase operation, the erase voltage Verase being applied to the common source line CSL may be blocked, and the potential of the common source line CSL may be discharged.

Figure 6A:
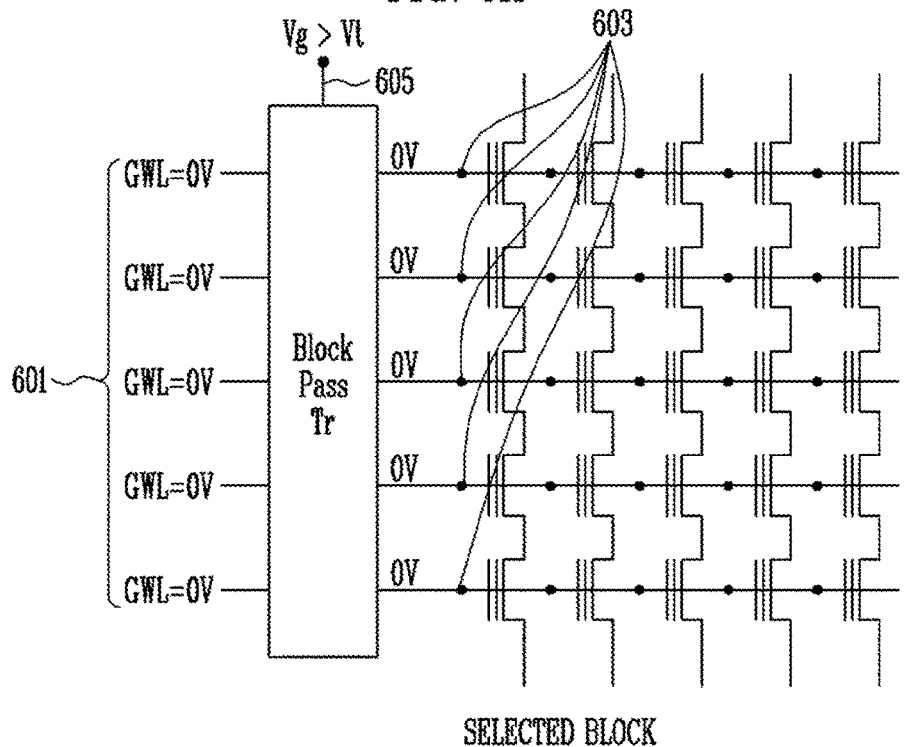
FIG. 6A is a view illustrating a representation of an example of voltages applied to a selected memory block during an erase operation.
Figure 6B:
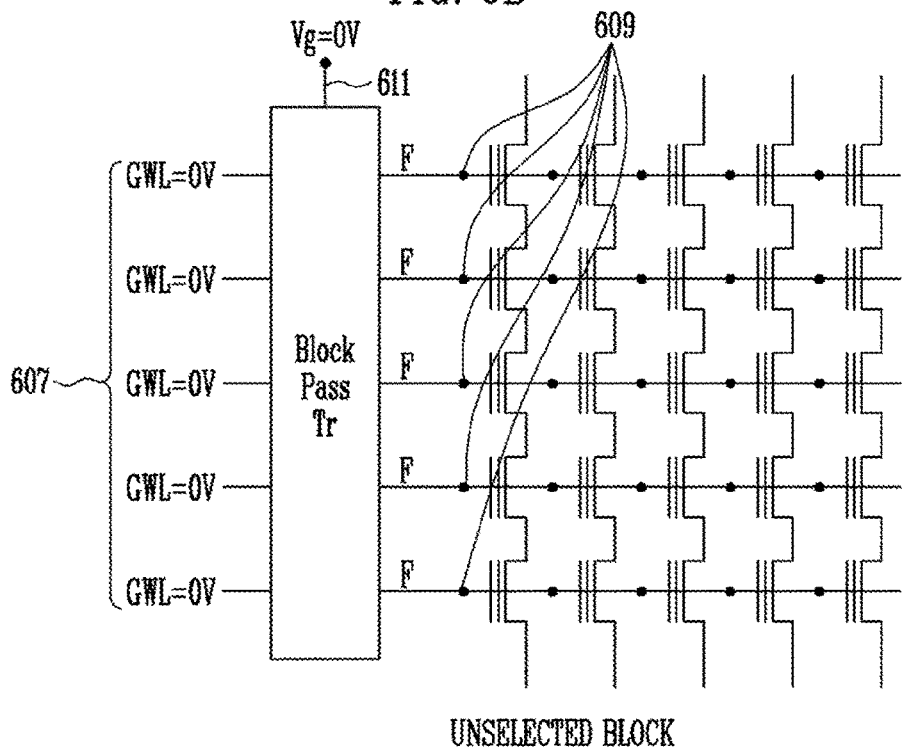
FIG. 6B is a view illustrating a representation of an example of voltages applied to an unselected memory block during an erase operation.

FIGS. 6A and 6B are views illustrating representations of examples of voltages applied to a selected memory block and an unselected memory block during an erase operation.

FIG. 6A is a diagram illustrating a voltage applied to a selected memory block, and FIG. 6B is a view illustrating a voltage applied to an unselected memory block.

Referring to FIG. 6A, a pass transistor may be turned on by applying a block word line voltage Vg greater than a threshold voltage Vt of the pass transistor to a block word line 605 when an erase operation is performed on a selected memory block. A voltage of 0V may be applied to global word lines 601, and the pass transistor may be turned on, so that the voltage of 0V may be transferred to local word lines 603.

Referring to FIG. 6B, since a voltage of 0V is applied to global word lines 607 and a block word line 611 coupled to a pass transistor in an unselected memory block (Vg=0V), the pass transistor may be turned off, and local word lines 609 may be in a floating state F.

Figure 7A:
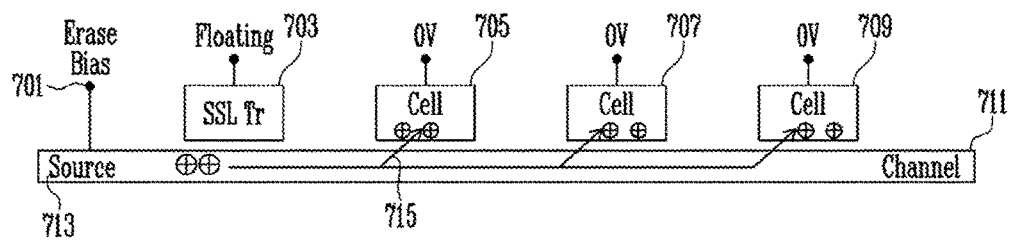
FIG. 7A is a view illustrating a representation of an example of hot holes flowing into a selected memory block during an erase operation.
Figure 7B:
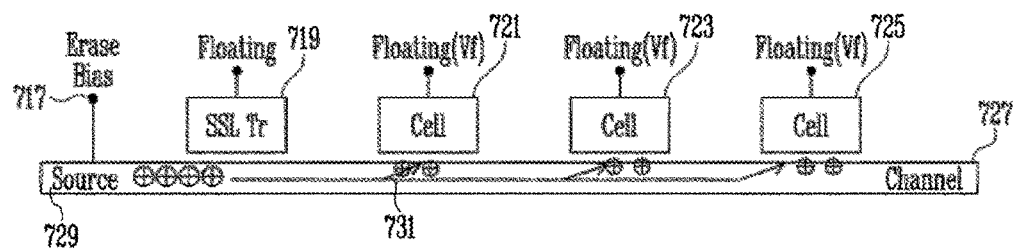
FIG. 7B is a view illustrating a representation of an example of hot holes flowing into an unselected memory block during an erase operation.

FIGS. 7A and 7B are views illustrating representations of examples of the introduction of hot holes during an erase operation.

FIG. 7A is a view illustrating a phenomenon occurring in a channel of a selected memory block. FIG. 7B is a view illustrating a phenomenon occurring in a channel of an unselected memory block.

Referring to FIG. 7A, in the selected memory block, an erase bias 701 having a high voltage level may be applied to a source 713. Since a source selection transistor 703 is in a floating state, a gate-induced drain leakage (GIDL) current may be generated due to a voltage difference between the source 713 and the source selection transistor 703, and hot holes may be generated and introduced in a direction of a channel 711 to increase a potential level of the channel. Since word lines of the selected memory block have a voltage of 0V, tunneling 715 of the hot holes into memory cells may occur to erase data from the memory cells 705, 707, and 709.

Referring to FIG. 7B, since an unselected memory block shares a source 729 with a selected memory block, an erase bias 717 having a high voltage level may be applied to the source 729. Word lines of memory cells 721, 723, and 725 as well as a source selection transistor 719 may be in a floating state. Therefore, a potential may be induced from an adjacent terminal by capacitive coupling to form a positive potential, so that hot holes may flow from a channel 727, or leakage of electrons from charge storage layers of the memory cells 721, 723, and 725 may be prevented. However, when a potential of a floating node of each of the memory cells 721, 723, and 725 is low, hot holes may flow into the channel 727 (731) and be trapped in a bulk region of the channel 727 although tunneling does not occur. However, this phenomenon may cause threshold voltages of the memory cells 721, 723, and 725 to appear to be shifted in a positive direction during a read operation. As a result, the reliability of the semiconductor memory device may be compromised.

Therefore, in the present specification, a semiconductor memory device and an operating method thereof capable of preventing hot holes from being introduced or trapped in a channel layer by increasing a potential level of a local word line of an unselected memory block during an erase operation are described.

Figure 8:
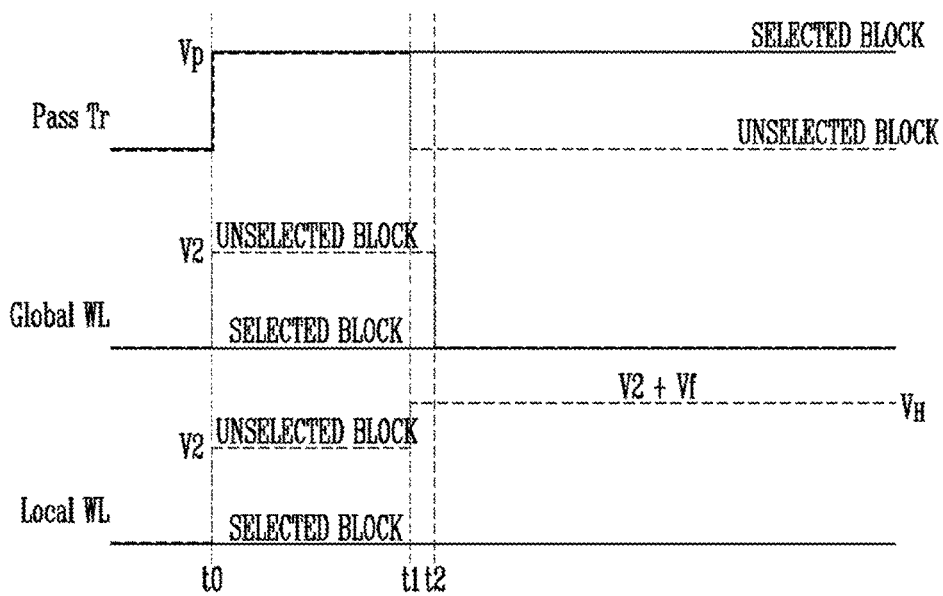
FIG. 8 is a view illustrating a representation of an example of voltages pulse applied to an unselected memory block according to an embodiment.

FIG. 8 is a diagram illustrating a representation of an example of voltage pulses applied to an unselected memory block according to an embodiment.

Referring to FIG. 8, for a selected memory block (solid line), the semiconductor memory device may turn on a pass transistor Pass Tr coupling a local word line Local WL and a global word line Global WL of the selected memory block to transfer a voltage (0V) of the global word line Global WL to the local word line Local WL during the entire time period. For example, the semiconductor memory device may apply a block voltage pulse Vp to a block word line coupled to a gate electrode of the pass transistor Pass Tr to turn on the pass transistor Pass Tr. The block voltage pulse Vp may have a greater level than the threshold voltage of the pass transistor Pass Tr corresponding to the selected memory block. A voltage of 0V may be applied to the global word line Global WL coupled to the selected memory block. Since the pass transistor Pass Tr is turned on, the voltage of 0V may be transferred to the local word line Local WL.

During a time interval between time points t0 and t1, for an unselected memory block (dotted line), the semiconductor memory device may turn on the pass transistor Pass Tr coupling the local word line Local WL and the global word line Global WL of the unselected memory block in order to increase a potential level of the local word line Local WL.

For example, the semiconductor memory device may apply the block voltage pulse Vp to the block word line coupled to the gate electrode of the pass transistor Pass Tr to turn on the pass transistor Pass Tr. The block voltage pulse Vp may have a greater level than the threshold voltage of the pass transistor Pass Tr corresponding to the selected memory block. A first voltage pulse V2 may be applied to the global word line Global WL coupled to the selected memory block. A level of the first voltage pulse V2 may be an arbitrary positive voltage level which is lower than that of the block voltage pulse Vp. Since the pass transistor Pass Tr is turned on, the first voltage pulse V2 applied to the global word line Global WL may be applied to the local word line Local WL. FIG. 8 illustrates that the block voltage pulse Vp and the first voltage pulse V2 are applied to the block word line and the global word line Global WL, respectively, at the same time. However, according to various embodiments, the block voltage pulse Vp and the first voltage pulse V2 may be sequentially applied to the applied to the block word line and the global word line Global WL, respectively.

At the time point t1, the semiconductor memory device may turn off the pass transistor Pass Tr of the unselected memory block. A voltage of the global word line Global WL may be maintained at the first voltage pulse V2. Since the pass transistor Pass Tr is turned off, the local word line Local WL may be in a floating state. A voltage of the local word line Local WL may be increased by a reference voltage Vf due to capacitive coupling between the local word line Local WL and an adjacent terminal. Therefore, the local word line Local WL may be floated in a high voltage (VH) state in which the local word line Local WL is increased by a level of the reference voltage Vf from a level of the first voltage pulse V2.

At the time point t2, the semiconductor memory device may discharge the first voltage pulse V2 being applied to the global word line Global WL to 0V. By discharging the global word line Global WL at the time point t2 later than the time point t1, the first voltage pulse V2 transferred to the local word line Local WL may be maintained. FIG. 8 illustrates that the global word line WL is discharged at the time point t2 delayed from the time point t1 at which the pass transistor Pass Tr is turned off. However, according to various embodiments, the global word line Global WL may also be performed at the time point t1.

Figure 9:
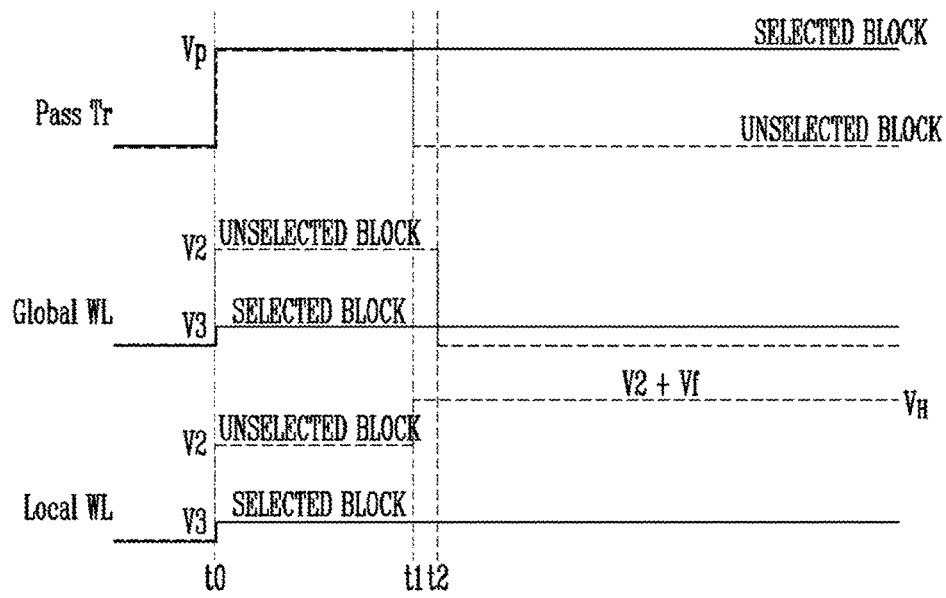
FIG. 9 is a view illustrating a representation of an example of an embodiment of a voltage pulse applied to an unselected memory block.

FIG. 9 is a diagram illustrating a representation of an example of an embodiment of a voltage pulse applied to an unselected memory block.

Referring to FIG. 9, for a selected memory block (solid line), the semiconductor memory device may turn on the pass transistor Pass Tr coupling the local word line Local WL and the global word line Global WL of the selected memory block to transfer a voltage of the global word line Global WL to the local word line Local WL during the entire time period. For example, the semiconductor memory device may apply the block voltage pulse Vp to a block word line coupled to a gate electrode of the pass transistor Pass Tr to turn on the pass transistor Pass Tr. The block voltage pulse Vp may have a greater level than a threshold voltage of the pass transistor Pass Tr corresponding to the selected memory block.

According to an embodiment illustrated in FIG. 9, a second voltage pulse V3 may be applied to the global word line Global WL coupled to the selected memory block. The second voltage pulse V3 may be greater than 0V and lower than the first voltage pulse V2 applied to the global word line Global WL coupled to an unselected memory block. Since the pass transistor Pass Tr is turned on, a voltage level of the second voltage pulse V3 may be directly transferred to the local word line Local WL. By applying the second voltage pulse V3 having a low voltage level greater than 0V and lower than the first voltage pulse V2 as the voltage of the global word line Global WL of the selected memory block, an excessive erase operation may be prevented.

At a time interval between the time points t0 and t1, for an unselected memory block (dotted line), the semiconductor memory device may turn on the pass transistor Pass Tr coupling the local word line Local WL and the global word line Global WL of the unselected memory block in order to increase the potential of the local word line Local WL.

For example, the semiconductor memory device may apply the block voltage pulse Vp to the block word line coupled to the gate electrode of the pass transistor Pass Tr to turn on the pass transistor Pass Tr. The block voltage pulse Vp may have a greater level than a threshold voltage of the pass transistor Pass Tr corresponding to the selected memory block. The first voltage pulse V2 may be applied to the global word line Global WL coupled to the selected memory block. The first voltage pulse V2 may have an arbitrary positive voltage level which is lower than that of the block voltage pulse Vp. Since the pass transistor Pass Tr is turned on, the first voltage pulse V2 applied to the global word line Global WL may be applied to the local word line Local WL. FIG. 9 illustrates that the block voltage pulse Vp and the first voltage pulse V2 are applied to the block word line and the global word line Global WL, respectively, at the same time. However, according to various embodiments, the block voltage pulse Vp and the first voltage pulse V2 may be sequentially applied to the applied to the block word line and the global word line Global WL, respectively.

At the time point t1, the semiconductor memory device may turn off the pass transistor Pass Tr of the unselected memory block. The voltage of the global word line Global WL may be maintained at the first voltage pulse V2. Since the pass transistor Pass Tr is turned off, the local word line Local WL may be in a floating state. The voltage of the local word line Local WL may be increased by the reference voltage Vf due to capacitive coupling between the local word line WL and an adjacent terminal. Therefore, the local word line Local WL may be floated in a high voltage (VH) state in which the local word line Local WL is increased by a level of the reference voltage Vf from the applied first voltage pulse V2.

At the time point t2, the semiconductor memory device may discharge the first voltage pulse V2 being applied to the global word line Global WL to 0V. By discharging the global word line Global WL at the time point t2 later than the time point t1, the first voltage pulse V2 transferred to the local word line Local WL may be maintained. FIG. 9 illustrates that the global word line WL is discharged at the time point t2 delayed from the time point t1 at which the pass transistor Pass Tr is turned off. However, according to various embodiments, the global word line Global WL may also be performed at the time point t1.

Figure 10:
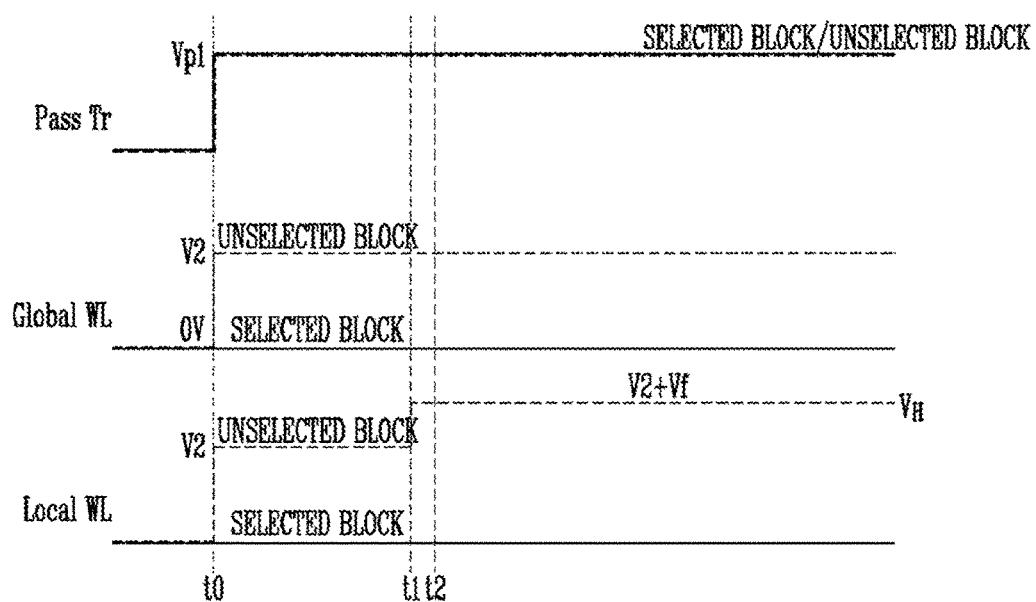
FIG. 10 is a view illustrating a representation of an example of an embodiment of a voltage pulse applied to an unselected memory block.

FIG. 10 is a diagram illustrating a representation of an example of an embodiment of a voltage pulse applied to an unselected memory block.

FIG. 10 illustrates voltages pulse applied to an unselected memory block when a plurality of memory blocks share a pass transistor block including a plurality of pass transistors. Since the pass transistor Pass Tr is turned on by the selected block, a high bias is to be applied to the global word line Global WL to maintain a bias of the local word line Local WL of the unselected memory block.

Referring to FIG. 10, the semiconductor memory device may turn on the pass transistor Pass Tr coupling the local word line Local WL and the global word line Global WL coupling the selected memory block and the unselected memory block during the entire time period. For example, a first block voltage pulse Vp1 may be applied to a block word line coupled to a gate electrode of the pass transistor Pass Tr in order to turn on the pass transistor Pass Tr. The first block voltage pulse Vp1 may have a greater level than a threshold voltage of the pass transistor Pass Tr corresponding to the selected memory block.

Since a voltage of 0V may be applied to the global word line Global WL of the selected memory block during the entire time period and the pass transistor Pass Tr is turned on, the voltage of 0V may be transferred to the local word line Local WL.

During a time interval between the time points t0 to t1, the first voltage pulse V2 may be applied to the global word line Global WL coupled to the unselected memory block. Since the pass transistor Pass Tr is turned on, the first voltage pulse V2 applied to the global word line Global WL may be transferred to the local word line Local WL. FIG. 10 illustrates that the first block voltage pulse Vp1 and the first voltage pulse V2 are applied to the block word line and the global word line Global WL, respectively, at the same time. However, according to various embodiments, the first block voltage pulse Vp1 and the first voltage pulse V2 may be sequentially applied to the applied to the block word line and the global word line Global WL, respectively.

According to an embodiment illustrated in FIG. 10, since the selected memory block and the unselected memory block share a pass transistor, a high bias is to be applied to a global word line of the unselected memory block in order to keep the pass transistor turned off with respect to the unselected memory block.

After the time point t1, the semiconductor memory device may maintain the bias of the global word line of the unselected memory block at the first voltage pulse V2. FIG. 10 illustrates that a potential of the first voltage pulse V2 is not changed and is maintained on the basis of the time point t1. However, according to an embodiment, the first voltage pulse V2 applied after the time point t1 may be greater than or equal to the first block voltage pulse Vp1.

When the pass transistor Pass Tr of the unselected memory block is turned off since the first voltage pulse V2 having a level greater than or equal to the first block voltage pulse Vp1 after the time point t1, the local word line Local WL may be in a floating state. A voltage of the local word line Local WL may be increased by the reference voltage Vf due to capacitive coupling between the local word line Local WL and an adjacent terminal. Therefore, the local word line Local WL may be floated in a high voltage (VH) state in which the local line Local WL is increased by a level of the reference voltage Vf from a level of the first voltage pulse V2.

According to an embodiment illustrated in FIG. 10, by applying the first voltage pulse V2 to the global word line Global WL of the unselected memory block without separately changing the bias at the time point t2, the pass transistor Pass Tr may remain turned off.

Figure 11:
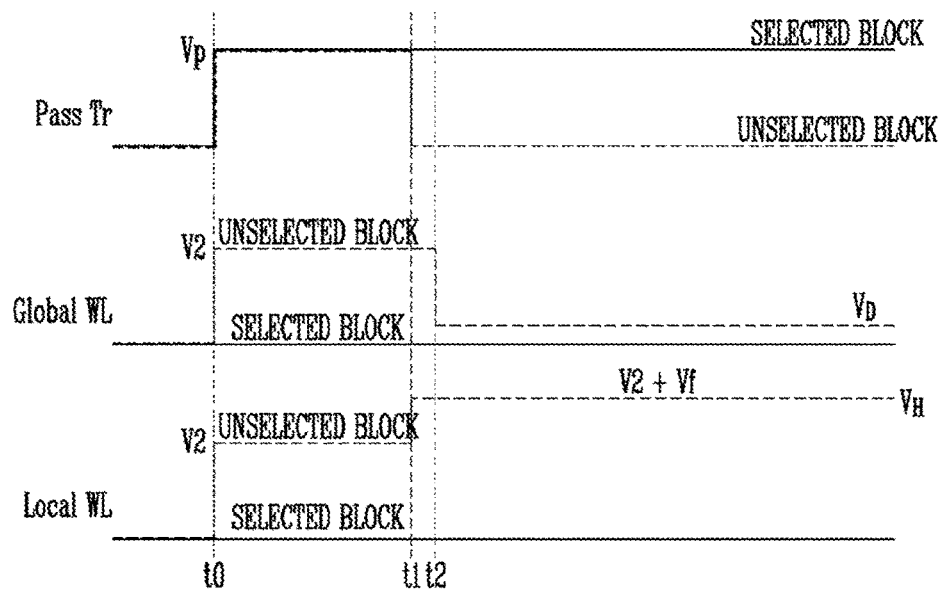
FIG. 11 is a view illustrating a representation of an example of an embodiment of a voltage pulse applied to an unselected memory block.

FIG. 11 is a diagram illustrating a representation of an example of an embodiment of a voltage pulse applied to an unselected memory block.

FIG. 11 illustrates a waveform of a voltage pulse applied to an unselected memory block when leakage occurs between a source and a drain of the pass transistor Pass Tr.

Referring to FIG. 11, for a selected memory block (solid line), the semiconductor memory device may turn on the pass transistor Pass Tr coupling the local word line Local WL and the global word line Global WL of the selected memory block to transfer a voltage (0V) of the global word line Global WL to the local word line Local WL during the entire time period. For example, the semiconductor memory device may apply the block voltage pulse Vp to the block word line coupled to the gate electrode of the pass transistor Pass Tr to turn on the pass transistor Pass Tr. The block voltage pulse Vp may have a greater level than the threshold voltage of the pass transistor Pass Tr corresponding to the selected memory block. Since a voltage of 0V may be applied to the global word line Global WL coupled to the selected memory block and the pass transistor Pass Tr is turned on, the voltage of 0V may be directly transferred to the local word line Local WL.

During a time interval between the time points t0 and t1, for the unselected memory block (dotted line), the semiconductor memory device may turn on the pass transistor Pass Tr coupling the local word line Local WL and the global word line Global WL of the unselected memory block in order to increase a potential level of the local word line Local WL.

For example, the block voltage pulse Vp may be applied to a block word line coupled to a gate electrode of the pass transistor Pass Tr to turn on the pass transistor Pass Tr. The block voltage pulse Vp may have a greater level than the threshold voltage of the pass transistor Pass Tr corresponding to the selected memory block. The first voltage pulse V2 may be applied to the global word line Global WL coupled to the selected memory block. A level of the first voltage pulse V2 may be an arbitrary positive voltage level and lower than a level of the block voltage pulse Vp. Since the pass transistor Pass Tr is turned on, the first voltage pulse V2 applied to the global word line Global WL may be transferred to the local word line Local WL. FIG. 11 illustrates that the block voltage pulse Vp and the first voltage pulse V2 are applied to the block word line and the global word line Global WL, respectively, at the same time. However, according to various embodiments, the block voltage pulse Vp and the first voltage pulse V2 may be sequentially applied to the applied to the block word line and the global word line Global WL, respectively.

At the time point t1, the semiconductor memory device may turn off the pass transistor Pass Tr of the unselected memory block. A voltage of the global word line Global WL may be maintained at the first voltage pulse V2. Since the pass transistor Pass Tr is turned off, the local word line Local WL may be in a floating state. The voltage of the local word line Local WL may be increased by the reference voltage Vf due to capacitive coupling with an adjacent terminal. Therefore, the local word line Local WL may be floated in a high voltage (VH) state in which the local word line Local WL is increased by a level of the reference voltage Vf from a level of the first voltage pulse V2.

At the time point t2, the semiconductor memory device may discharge the first voltage pulse V2 being applied to the global word line Global WL to a discharge voltage VD. The first voltage pulse V2 transferred to the local word line Local WL may be maintained by discharging the global word line Global WL at the time point t2 later than the time point t1. FIG. 11 illustrates that the global word line WL is discharged at the time point t2 delayed from the time point t1 at which the pass transistor Pass Tr is turned off. However, according to various embodiments, the global word line Global WL may also be performed at the time point t1. The global word line Global WL may also be discharged at the time point t1.

Referring to FIG. 11, when the discharge voltage of the global word line Global WL of the unselected memory block is not 0V but the discharge voltage VD having an arbitrary positive voltage level, reduction of the potential of the local word line Local WL caused by leakage may be prevented.

Figure 12:
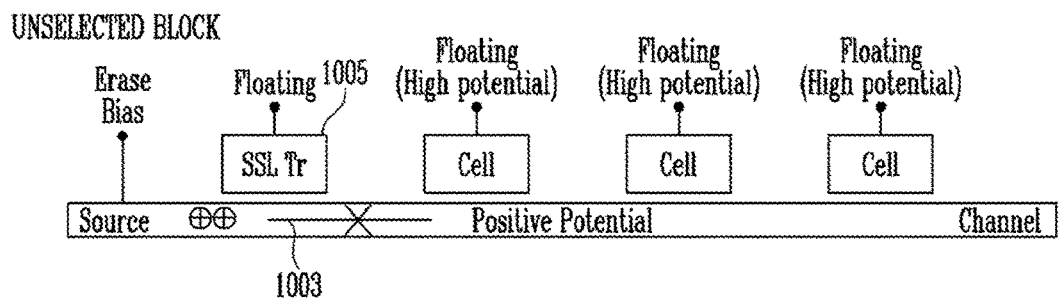
FIG. 12 is a view illustrating a representation of an example of effects caused by operations of a semiconductor memory device according to an embodiment.

FIG. 12 is a diagram illustrating a representation of an example of effects caused by operations of a semiconductor memory device according to an embodiment.

Referring to FIG. 12, the semiconductor memory device may maintain a high potential of the local word line by applying biases of the block word line and the global word line with respect to the unselected memory block as described with reference to FIGS. 8 to 11.

Even when a high-voltage erase bias is applied to a source, a potential of a source selection transistor 1005 may be increased so that a potential difference between the source selection transistor 1005 and a source junction may be reduced (1003). Therefore, generation of hot holes caused by GIDL current in an overlap region may be reduced.

When a local word line forms a high potential, a lateral electric field in a channel direction and a vertical electric field in a direction of memory cells may be reduced even when a potential of the channel is increased. As a result, it may be difficult for hot holes to flow in the channel direction or the direction of the memory cells. Therefore, quantity of electric charge trapped in a channel region may be reduced to thereby reduce an error rate during a read operation.

Figure 13:
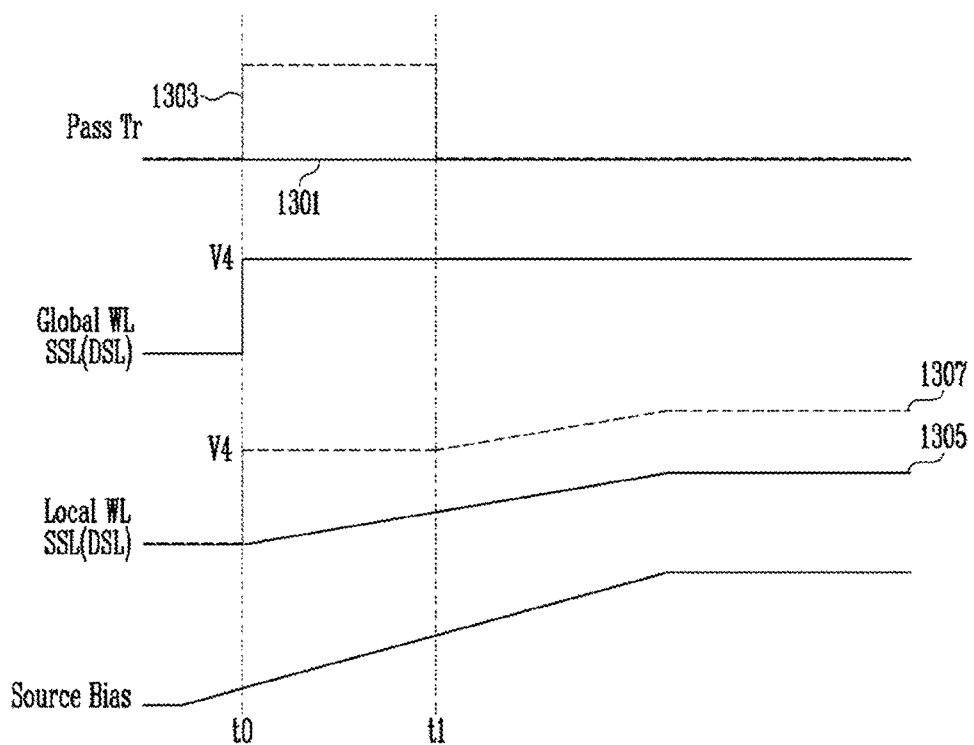
FIG. 13 is a view illustrating a representation of an example of a potential change of a source selection line by a voltage pulse applied to an unselected memory block.

FIG. 13 is a diagram illustrating a potential change of a source selection line caused by a voltage pulse applied to an unselected memory block.

In order to suppress generation of hot holes caused by GIDL current between a source and a source selection transistor SSL Tr of the unselected memory block, a potential difference between the high-voltage erase voltage applied to the source and the source selection transistor SSL Tr is to be small. Therefore, it may be necessary to increase the potential of the source selection transistor SSL Tr.

Referring to FIG. 13, during the conventional erase operation, a voltage of 0V may be applied (1301) to a block word line of the unselected memory block to turn off the pass transistor Pass Tr. Therefore, biases of the global word line Global WL, a global source selection line Global SSL and a global drain selection line Global DSL may not be transferred to the local word line Local WL, a local source selection line Local SSL and a local drain selection line Local DSL. When the pass transistor Pass Tr is turned off, potentials of the local word line Local WL, the local source selection line Local SSL and the local drain selection line Local DSL may be slightly increased by capacitive coupling (1305).

The semiconductor memory device according to an embodiment may turn on the pass transistor Pass Tr by applying a positive voltage pulse 1303 to a gate electrode of the pass transistor Pass Tr during the time interval between the time points t0 and t1 in which an erase voltage is applied to a common source terminal Source Bias (1303). In addition, a third voltage pulse V4 may be applied to the word line Global WL, the global source selection line Global SSL and the global drain selection line Global DSL during the same time interval. Since the pass transistor Pass Tr is turned on, the third voltage pulse V4 may be transferred to the local word line Local WL, the local source selection line Local SSL and the local drain selection line.

At the time point t1, the semiconductor memory device may turn off the pass transistor Pass Tr by discharging the block word line of the unselected memory block. The potentials of the local word line Local WL, the local source selection line Local SSL and the local drain selection line Local DSL may be increased by the sum of the third voltage pulse level induced from the global word line Global WL, the global source selection line Global SSL and the global drain selection line Global DSL and the potential caused the capacitive coupling.

Figure 14:
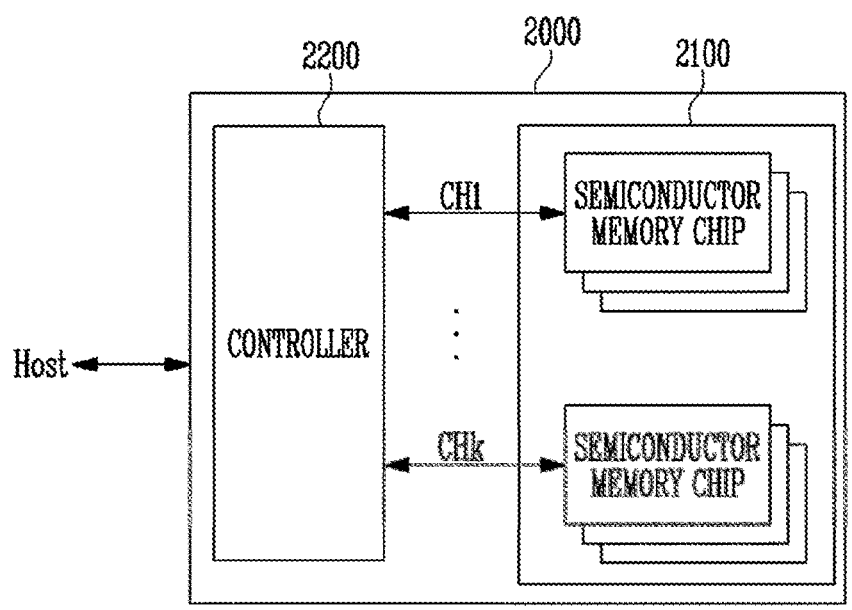
FIG. 14 is a block diagram illustrating a representation of an example of an application example of a memory system including a semiconductor memory device according to an embodiment.

FIG. 14 is a block diagram illustrating an application example (2000) of the memory system shown 1000 in FIG. 1.

Referring to FIG. 14, a memory system 2000 may include a semiconductor memory device 2100 and a controller 2200. The semiconductor memory device 2100 may include a plurality of semiconductor memory chips. The semiconductor memory chips may be divided into a plurality of groups.

FIG. 14 illustrates the plurality of groups communicating with the controller 220 through first to k-th channels CH1 to CHk, respectively. Each of the memory chips may be configured and operated in substantially the same manner as the semiconductor memory device 100 described above with reference to FIG. 4.

Each of the groups may communicate with the controller 2200 through a single common channel. The controller 2200 may be configured in substantially the same manner as the controller 200 as described above with reference to FIG. 1 and may control the plurality of memory chips of the semiconductor memory device 2100.

FIG. 14 illustrates the plurality of semiconductor memory chips coupled to a single channel. However, the memory system 2000 may be modified so that a single semiconductor memory chip may be coupled to a single channel.

The controller 2200 and the semiconductor memory device 2100 may be integrated into a single semiconductor device. In an example of an embodiment, the controller 2200 and the semiconductor memory device 2100 may be integrated into a single semiconductor device to form a memory card. For example, the controller 2200 and the semiconductor memory device 2100 may be integrated into a single semiconductor device to form a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or universal flash storage (UFS).

The controller 2200 and the semiconductor memory device 2100 may be integrated into a single semiconductor device to form a semiconductor drive (Solid State Drive (SSD)). The semiconductor drive (SSD) may include a storage device configured to store data in a semiconductor memory. When the memory system 1000 is used as the semiconductor drive (SSD), an operating speed of the host coupled to the memory system 1000 may be remarkably improved.

In an example, the memory system 2000 may be used as one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device and/or one of various devices for computing systems, etc.

In an example of an embodiment, the semiconductor memory device 2100 or the memory system 2000 may be packaged in a variety of ways. For example, the semiconductor memory device 2100 or the memory system 2000 may be packaged using various methods such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP) and/or a wafer-level processed stack package (WSP), etc.

Figure 15:
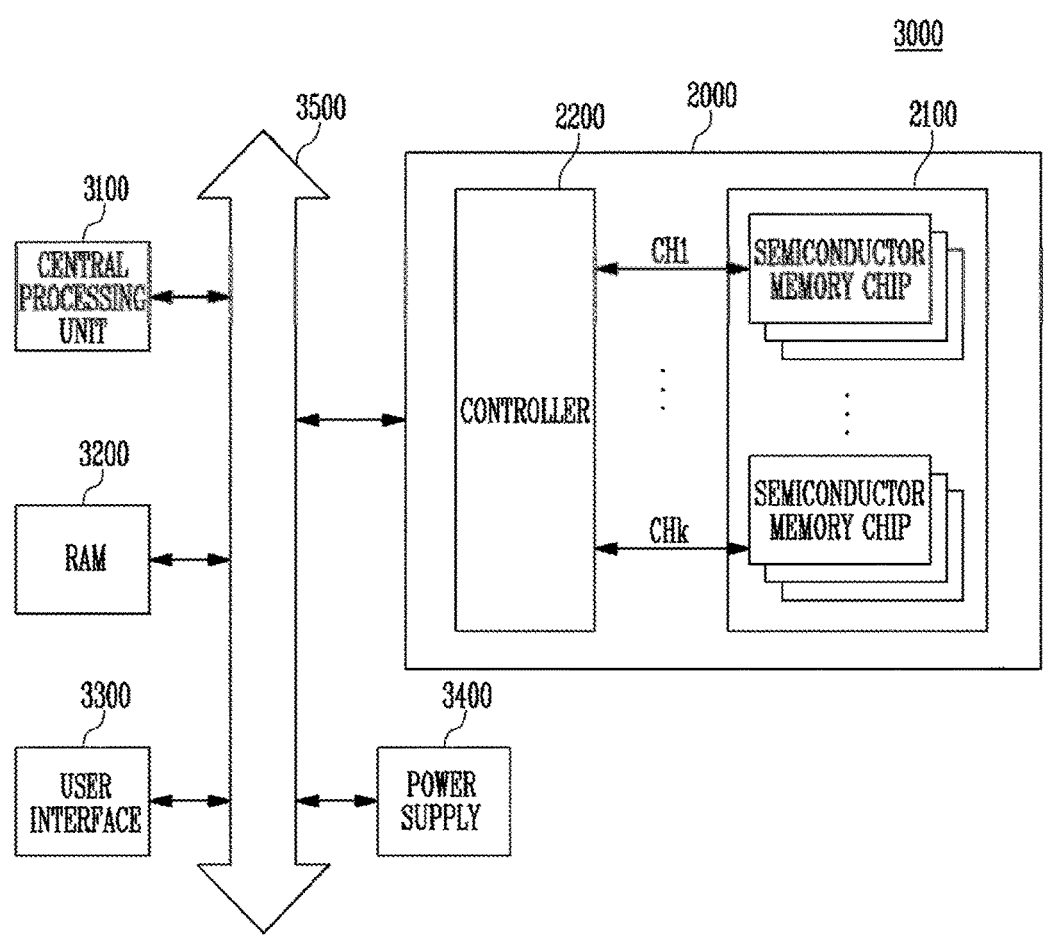
FIG. 15 is a block diagram illustrating a representation of an example of a computing system including a memory system described with reference to FIG. 14.

FIG. 15 is a block diagram illustrating a computing system 3000 including the memory system 2000 illustrated in FIG. 14.

Referring to FIG. 15, the computing system 3000 may include a central processing unit 3100, random access memory (RAM) 3200, a user interface 3300, a power supply 3400, a system bus 3500 and the memory system 2000.

The memory system 2000 may be electrically coupled to the central processing unit 3100, the RAM 3200, the user interface 3300 and the power supply 3400 through the system bus 3500. Data provided through the user interface 3300 or processed by the central processing unit 3100 may be stored in the memory system 2000.

FIG. 15 illustrates the semiconductor memory device 2100 coupled to the system bus 3500 through the controller 2200. However, the semiconductor memory device 2100 may be directly coupled to the system bus 3500. Functions of the controller 2200 may be performed by the central processing unit 3100 and the RAM 3200.

FIG. 15 illustrates the memory system 2000 described above with reference to FIG. 14. However, the memory system 2000 may be replaced by the memory system 1000 described above with reference to FIG. 1. In an example of an embodiment, the computing system 3000 may include both memory systems 1000 and 2000 described above with reference to FIGS. 1 and 14, respectively.

According to embodiments, a semiconductor memory device having improved reliability and an operating method thereof may be provided.

While the present disclosure has been described with reference to examples of embodiments thereof, it will be understood by those of ordinary skill in the art that various changes in form and details may be made therein without departing from the spirit and scope of the present disclosure as defined by the following claims.

In the above-described examples of embodiments, features or steps described herein may be omitted, additional steps or features may be included, and/or features or steps described herein may be combined in a manner different from the specific combinations recited herein without departing from the spirit of the application, all as understood by those of skill in the art.

Although the examples of embodiments of the present disclosure have been illustrated and the accompanying drawings and specific terms have been used, they are used in a general meaning in order to assist in the understanding the present disclosure and do not limit the scope of the present disclosure. It will be obvious to those skilled in the art to which the present disclosure pertains that other modifications based on the spirit of the present disclosure may be made in addition to the above-mentioned examples of embodiments.

What is claimed is:

1. A semiconductor memory device, comprising:
a memory cell array including a plurality of memory cells;
coupling circuits including pass transistors coupled between global lines and local lines coupled to the plurality of memory cells; and
an address decoder coupled to block word lines coupled to gates of the pass transistors and the global lines,
wherein the address decoder applies a voltage pulse to the local lines coupled to an unselected memory block and floats the local lines during an erase operation of memory cells included in a selected memory block, among the plurality of memory cells,
wherein the address decoder applies a block voltage pulse to turn on the pass transistors coupling memory cells included in the unselected memory block, applies the voltage pulse to the global lines coupled to the unselected memory block when the pass transistors are turned on, and turns off the pass transistors, and
wherein the address decoder applies a low voltage pulse having a level greater than a ground voltage and lower than the voltage pulse to the global lines coupled to the selected memory block.

2. The semiconductor memory device of claim 1,
wherein the block voltage pulse applied to a block word line coupled to a gate electrode of a pass transistor to turn on is greater than a threshold voltage level of the pass transistor corresponding to the selected memory block.

3. The semiconductor memory device of claim 1, wherein the address decoder turns off the pass transistors and discharges the global lines.

4. The semiconductor memory device of claim 3, wherein the global lines are discharged a point in time after the pass transistors are turned off.

5. The semiconductor memory device of claim 1, wherein the address decoder applies the block voltage pulse and the voltage pulse at the same time.

6. The semiconductor memory device of claim 1,
wherein the block voltage pulse is applied at a first time and the voltage pulse is applied at a second time, and
wherein the first time and the second time differ.

7. The semiconductor memory device of claim 3, wherein the address decoder discharges the global lines to a ground voltage level.

8. The semiconductor memory device of claim 3, wherein the address decoder discharges the global lines to a discharge voltage level lower than a level of the voltage pulse.

9. The semiconductor memory device of claim 1, wherein the global lines include at least one of a global word line, a global source selection line, and a global drain selection line.

10. A method of operating a semiconductor memory device including a plurality of memory cells, the method comprising:

applying a block voltage pulse to turn on pass transistors coupling memory cells included in an unselected memory block, among the plurality of memory cells;
applying a voltage pulse to local lines coupled to the unselected memory block and floating the local lines during an erase operation of memory cells included in a selected memory block, among the plurality of memory cells; and
applying a low voltage pulse having a level greater than a ground voltage and lower than the voltage pulse to global lines coupled to the selected memory block,
wherein the floating of the local lines comprises:
applying the voltage pulse to global lines coupled to the unselected memory block when the pass transistors are turned on; and
turning off the pass transistors.

11. The method of claim 10,
wherein the block voltage pulse applied to a block word line coupled to a gate electrode of a pass transistor to turn on is greater than a threshold voltage level of the pass transistor corresponding to the selected memory block.

12. The method of claim 10, further comprising discharging the global lines.

13. The method of claim 10, wherein the block voltage pulse and the voltage pulse are applied at the same time.

14. The method of claim 10, wherein the block voltage pulse is applied at a first time and the voltage pulse is applied at a second time, and
wherein the first time and the second time differ.

15. The method of claim 12, wherein the global lines are discharged to a ground voltage level.

16. The method of claim 12, wherein the global lines are discharged to a discharge voltage level lower than a level of the voltage pulse.

17. The method of claim 10, wherein the global lines include at least one of a global word line, a global source selection line, and a global drain selection line.

18. A semiconductor memory device, comprising:
a memory cell array including a plurality of memory cells;
coupling circuits including pass transistors coupled between global lines and local lines coupled to the plurality of memory cells; and
a peripheral circuit coupled to a block word line coupled in common to gates of the pass transistors and the global lines,
wherein the peripheral circuit applies a voltage pulse to global lines coupled to an unselected memory block when the pass transistors coupling memory cells included in the unselected memory block are turned on and applies a low voltage pulse having a level greater than a ground voltage and lower than the voltage pulse to the global lines coupled to the selected memory block.

* * * * *